United States Patent
Dos Santos Ramos et al.

(10) Patent No.: US 9,037,424 B2
(45) Date of Patent: May 19, 2015

(54) SYSTEMS AND METHODS FOR DETECTING ULTRACAPACITOR CELL SHORT CIRCUITS

(75) Inventors: Igor Dos Santos Ramos, Minnetonka, MN (US); Andrew A. Knitt, Deer Creek, IL (US); Wellington Ying-Wei Kwok, Dunlap, IL (US); Kaiyu Wang, Vernon, CT (US)

(73) Assignee: Caterpillar Inc., Peoria, IL (US)

( * ) Notice: Subject to any disclaimer, the term of this patent is extended or adjusted under 35 U.S.C. 154(b) by 509 days.

(21) Appl. No.: 13/461,193

(22) Filed: May 1, 2012

(65) Prior Publication Data

US 2013/0297237 A1 Nov. 7, 2013

(51) Int. Cl.
*G01R 31/02* (2006.01)
*G06F 19/00* (2011.01)
*G01R 31/08* (2006.01)
*G01R 31/36* (2006.01)

(52) U.S. Cl.
CPC ............ *G01R 31/025* (2013.01); *G01R 31/362* (2013.01); *G01R 31/028* (2013.01)

(58) Field of Classification Search
CPC .. G01R 31/028; G01R 31/025; G01R 31/362; H02J 7/0019; H02J 7/345
USPC ...................... 702/58, 59, 64, 185; 324/76.11; 320/167
See application file for complete search history.

(56) References Cited

U.S. PATENT DOCUMENTS

| | | | |
|---|---|---|---|
| 6,841,971 B1 | 1/2005 | Spée et al. | |
| 7,206,705 B2 | 4/2007 | Hein | |
| 7,471,068 B2 * | 12/2008 | Cegnar | 320/167 |
| 7,633,284 B2 | 12/2009 | Ingram et al. | |
| 7,680,612 B2 | 3/2010 | Oohasi et al. | |
| 2005/0249989 A1 | 11/2005 | Pearson | |
| 2008/0058995 A1 | 3/2008 | Holindrake et al. | |
| 2008/0223381 A1 | 9/2008 | Schmidt et al. | |
| 2008/0278115 A1 | 11/2008 | Huggins | |
| 2013/0278227 A1 * | 10/2013 | Knitt et al. | 320/167 |

\* cited by examiner

*Primary Examiner* — John H Le
(74) *Attorney, Agent, or Firm* — Finnegan, Henderson, Farabow, Garrett & Dunner, LLP

(57) ABSTRACT

A system for detecting a short-circuited ultracapacitor cell in a machine is disclosed. The system may have a memory that stores instructions and one or more processors capable of executing the instructions. The one or more processors may be configured to perform cell balancing among ultracapacitor cells arranged within two or more ultracapacitor modules, each ultracapacitor module including at least two ultracapacitor cells connected in series. The one or more processors may be further configured to measure a module voltage generated by each of the plurality of ultracapacitor modules after performing the cell balancing and before applying a load of the machine to the ultracapacitor modules, and determine whether an ultracapacitor cell among the plurality of ultracapacitor cells is short-circuited based on a comparison of the measured module voltages.

17 Claims, 4 Drawing Sheets

SYSTEMS AND METHODS FOR DETECTING ULTRACAPACITOR CELL SHORT CIRCUITS

TECHNICAL FIELD

The present disclosure relates generally to methods and systems for detecting ultracapacitor cell short circuits and more particularly, to methods and systems for detecting a short-circuited ultracapacitor cell included in an ultracapacitor pack of a machine.

BACKGROUND

Electric double-layer capacitors (EDLCs), commonly referred to as supercapacitors or ultracapacitors (herein referred to as ultracapacitors), may be used for a wide variety of applications, e.g., as a power source for electric and/or hybrid machines, as a power source for various electronic devices, etc. A single ultracapacitor cell generally has a working voltage between approximately 0 and 3 volts. Thus, to achieve higher voltages, multiple ultracapacitor cells may be connected in series as an ultracapacitor module. Moreover, multiple ultracapacitor modules may also be connected in series to form an ultracapacitor pack and achieve yet a higher voltage.

When using ultracapacitors for power applications as discussed above, it may be desirable to detect problems occurring with one or more ultracapacitor cells within the ultracapacitor pack. For example, it may be desirable to detect whether an ultracapacitor cell is short-circuited because a short-circuited cell may lead to decreased performance or pose safety concerns such as potential fire hazards.

An exemplary system that may be used to determine certain conditions within an ultracapacitor, such as a short-circuited ultracapacitor cell, is disclosed in U.S. Pat. No. 7,633,284 to Ingram et al. that issued on Dec. 15, 2009 (the '284 patent). The system in the '284 patent measures parameters such as the voltages of each individual ultracapacitor cell and determines certain conditions such as cell short circuits based on the individual cell measurements. Although the system of the '284 patent may be useful for detecting an ultracapacitor cell short circuit, the system may be unnecessarily costly, large, and complex due to the hardware and software requirements associated with measuring the parameters of each individual cell.

The disclosed machine implement control system is directed to overcoming one or more of the problems set forth above and/or other problems of the prior art.

SUMMARY

In one aspect, the present disclosure is directed to a computer-implemented method for detecting a short-circuited ultracapacitor cell on a machine. The method may include performing cell balancing among a plurality of ultracapacitor cells arranged within a plurality of ultracapacitor modules. The method may further include measuring a module voltage generated by each of the plurality of ultracapacitor modules after performing the cell balancing and prior to applying a load of the machine to the ultracapacitor modules, and determining whether an ultracapacitor cell among the plurality of ultracapacitor cells is short-circuited based on a comparison of the measured module voltages.

In another aspect, the present disclosure is directed to a system for detecting a short-circuited ultracapacitor cell on a machine. The system may include a memory that stores instructions and one or more processors capable of executing the instructions. The one or more processors may be configured to perform cell balancing among ultracapacitor cells arranged within two or more ultracapacitor modules, each ultracapacitor module including at least two ultracapacitor cells connected in series. The one or more processors may be further configured to measure a module voltage generated by each of the plurality of ultracapacitor modules after performing the cell balancing and before applying a load of the machine to the ultracapacitor modules, and determine whether an ultracapacitor cell among the plurality of ultracapacitor cells is short-circuited based on a comparison of the measured module voltages.

In yet another aspect, the present disclosure is directed to a computer-readable storage device storing instructions for detecting a short-circuited ultracapacitor cell on a machine. The instructions may cause one or more computer processors to perform cell balancing among a plurality of ultracapacitor cells arranged within a plurality of ultracapacitor modules, and measure a module voltage generated by each of the plurality of ultracapacitor modules after performing the cell balancing and before applying a load of a machine to the ultracapacitor modules. The instructions may further cause the one or more computer processors to determine whether an ultracapacitor cell among the plurality of ultracapacitor cells is short-circuited based on a comparison of the measured module voltages.

DETAILED DESCRIPTION

Figure 1:
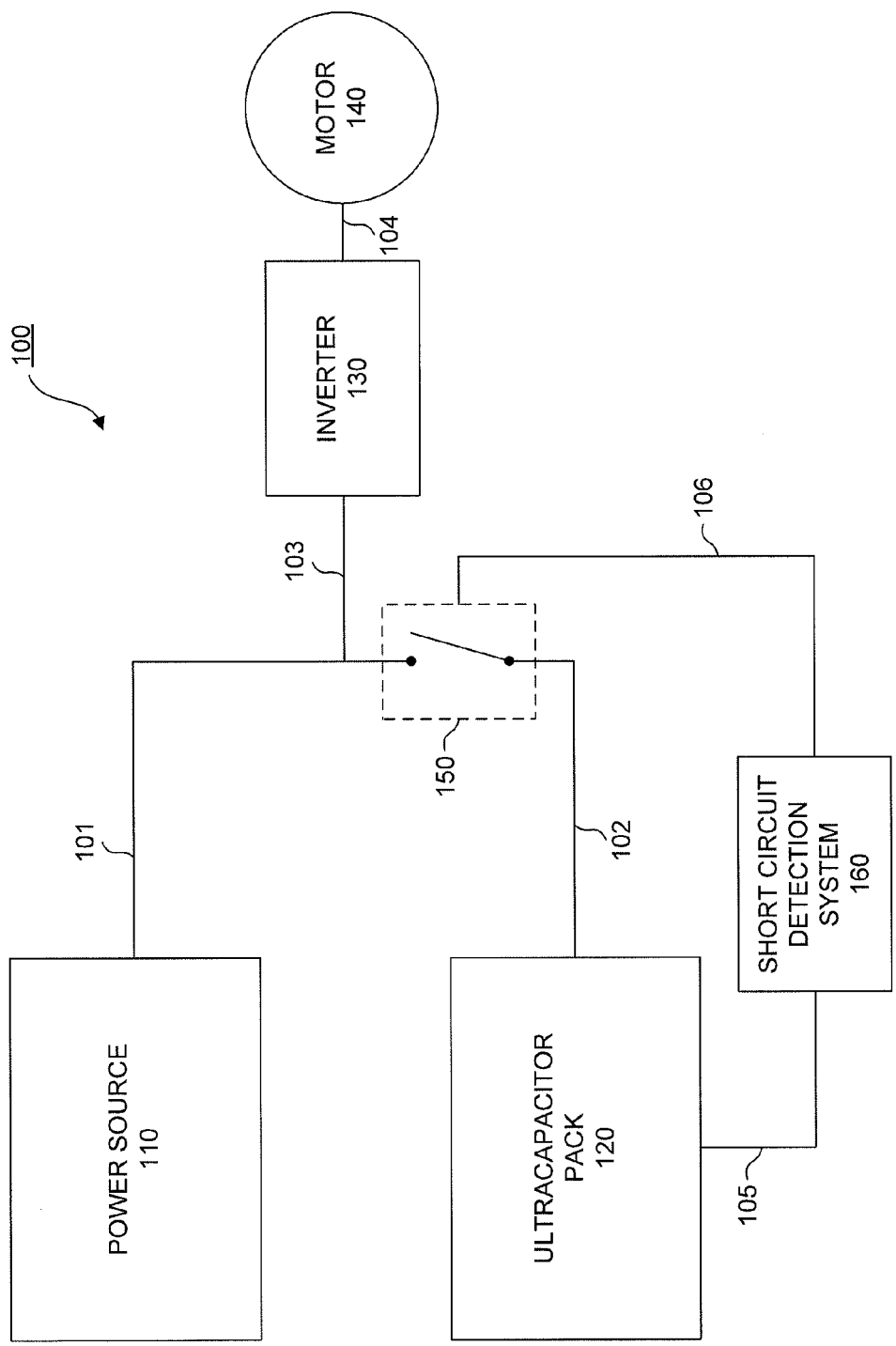
FIG. 1 is a diagrammatic illustration of an exemplary disclosed power system for use in a machine.

FIG. 1 illustrates an exemplary power system 100 that may be included in and used to power one or more components of a machine, such as a material moving machine (e.g., a dozer, loader, excavator, backhoe, motor grader, etc.) Power system 100 may include a power source 110, an ultracapacitor pack 120, an inverter 130, a motor 140, and a short circuit detection system 160. Power source 110 and/or ultracapacitor pack 120 may generate current to drive a mechanical output of motor 140 and/or other motors and devices on the machine.

Power source 110 may include any system capable of generating power, such as a fuel cell, an internal combustion engine coupled to a generator, etc. Power source 110 may be electrically coupled to inverter 130 via bus 101 and bus 103. Power source 110 may be configured to provide a direct current (DC) or alternating current (AC) output at a desired voltage. If power source 110 outputs AC power, then an AC/DC converter may be included to convert the AC power to DC power before it reaches inverter 130. Power source 110 may also be connected to bus 101 via one or more switches, contactors, relays, etc. (not shown).

Ultracapacitor pack 120, discussed in greater detail below with respect to FIG. 2, may include a plurality of ultracapacitor modules (each including a plurality of ultracapacitor cells) connected in series to provide a DC output to bus 102. Ultracapacitor pack 120 may be electrically coupled to inverter 130 via bus 102, switch 150, and bus 103. Switch 150 may include one or more switches, contactors, relays, etc., that may be configured to electrically isolate ultracapacitor pack 120 from bus 103 and, thus, inverter 130. For example, when the machine that includes power system 100 is not in operation, or when the machine is in operation but does not require power from ultracapacitor pack 120, switch 150 may be open to electrically isolate ultracapacitor pack 120.

Short circuit detection system 160, also discussed in greater detail below with respect to FIG. 2, may be connected to ultracapacitor pack 120 via bus 105 and to switch 150 via bus 106. As discussed below, short circuit detection system 160 may implement one or more ultracapacitor cell short circuit detection programs or algorithms to detect whether one or more ultracapacitor cells contained in the ultracapacitor modules of ultracapacitor pack 120 have short-circuited. Short circuit detection system 160 may also control the operation of switch 150 via bus 106 to selectively isolate and connect ultracapacitor pack 120 to bus 103. Alternatively, another controller (not shown) may control switch 150, and short circuit detection system 160 may receive state information regarding the state of switch 150 (e.g., whether it is open or closed).

Short circuit detection system 160 may include or be included with other control functionality for the machine that includes power system 100. For example, short circuit detection system 160 may be a part of an electronic control unit, such as an engine control unit, that controls other aspects of the machine. Alternatively, short circuit detection system 160 may be provided separate from but communicatively coupled to other control functionality of the machine.

Inverter 130 may receive DC power from power source 110 and/or ultracapacitor pack 120 via bus 103 and may convert it to AC power which may be provided to motor 140 via bus 104. Inverter 130 may embody any inverter known in the art. That is, inverter 130 may embody any combination of power electronics, hardware, and/or software operable to convert DC power to AC power. For example, inverter 130 may include a three-phase inverter configured to generate three current signals to power motor 140. In certain embodiments, inverter 130 may be a pulse-width modulation (PWM) inverter. Further, inverter 130 may operate through the use of one or more switches or similar devices to convert DC power to AC power. For example, inverter 130 may include any number of thyristors, insulated gate bipolar transistors (IGBTs), metal-oxide-semiconductor field-effect transistors (MOSFETs), bipolar junction transistors (BJTs), resistors, capacitors, inductors, diodes, etc., configured to operate according to the present disclosure.

Motor 140 may be any type of motor generally operable to receive one or more current signals from bus 104 and use them to produce a mechanical power output. In certain embodiments, motor 140 may receive one or more AC current signals from inverter 130. In other embodiments, motor 140 may be a DC motor, i.e., it may be configured to receive DC current. Inverter 130 may not be included in embodiments where motor 140 is a DC motor. Motor 140 may include a traction motor used to drive the machine and/or one or more accessory motors used to drive one or more accessories or implements on the machine. Additionally, while only one motor 140 is shown in FIG. 1, any number of motors may be powered by power system 100.

Figure 2:
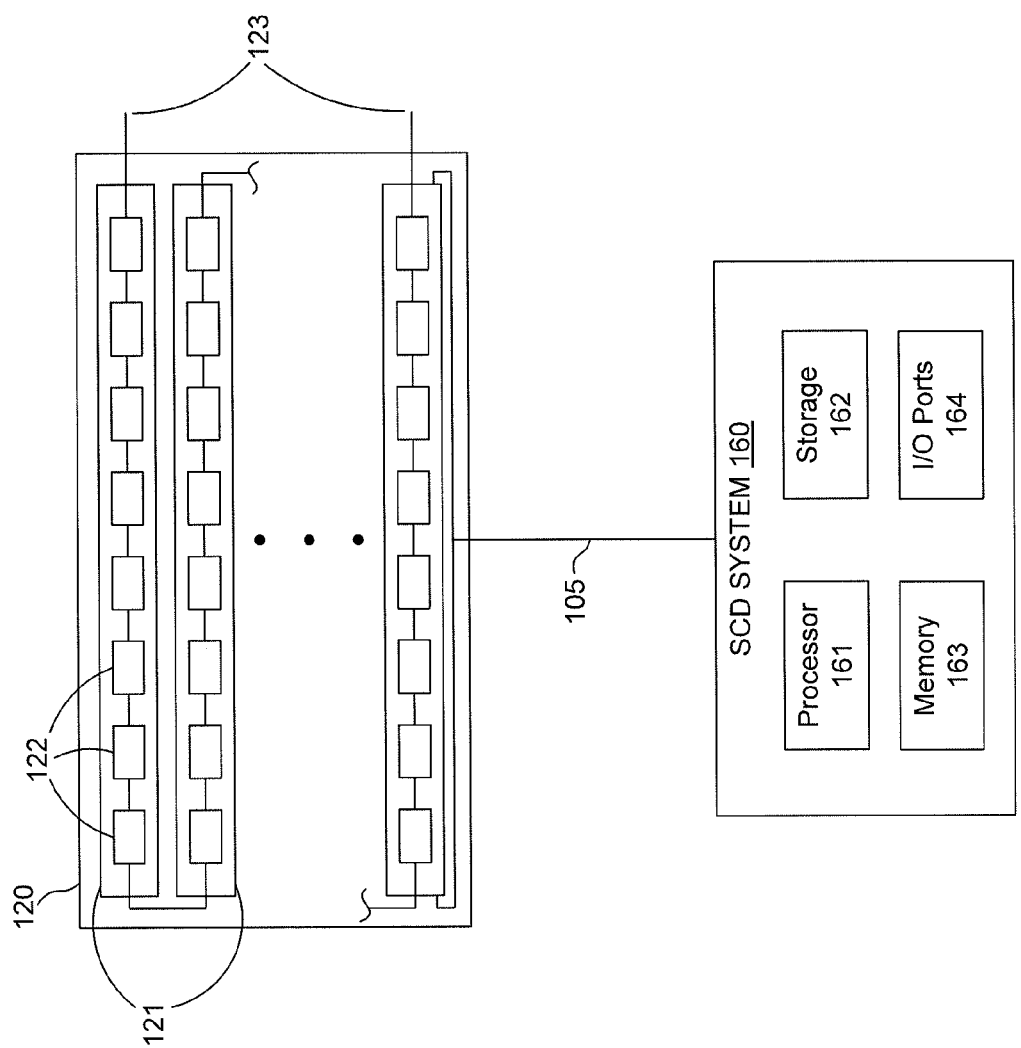
FIG. 2 is a diagrammatic illustration of an exemplary ultracapacitor cell short circuit detection system that may be used in conjunction with the power system of FIG. 1.

FIG. 2 shows the connection between short circuit detection system 160 and ultracapacitor pack 120 via bus 105 in greater detail. As shown in FIG. 2, ultracapacitor pack 120 may include multiple ultracapacitor modules 121 connected to each other in series. Each ultracapacitor module 121 may, in turn, include multiple ultracapacitor cells 122 connected to each other in series. Each ultracapacitor cell 122 may be capable of outputting a voltage on the order of a few volts. For example, each ultracapacitor cell 122 may have an output voltage range from 0 to ~3 volts. Because each ultracapacitor module 121 includes multiple ultracapacitor cells 122 connected in series, an ultracapacitor module 121 is capable of outputting a voltage equal to the sum of the voltages of the individual ultracapacitor cells 122 contained therein. For example, eight ultracapacitor cells 122 are included in each ultracapacitor module 121 shown in FIG. 2. Thus, each ultracapacitor module 121 may have an output voltage range between 0 and ~24 volts. Likewise, because the ultracapacitor modules 121 in ultracapacitor pack 120 are connected in series, the total output voltage of ultracapacitor pack 120 that may be output across terminals 123 is equal to the sum of the output voltages of the ultracapacitor modules 121 contained therein.

Those skilled in the art will appreciate that any configuration of ultracapacitor cells 122 and ultracapacitor modules 121 may be used. For example, in one embodiment, ultracapacitor pack 120 may include eight ultracapacitor modules 121 that each include eighteen ultracapacitor cells 122. In this embodiment, the output voltage of ultracapacitor pack 120 may be between 0 and ~430 volts (i.e., approximately 144 cells multiplied by 3 volts).

As discussed, ultracapacitor pack 120 may be configured to provide a current to bus 102, e.g., via terminals 123. For example, a charging device (not shown) that is part of or connectable to the machine that includes ultracapacitor pack 120 may charge ultracapacitor cells 122 so that ultracapacitor pack 120 may provide the current to bus 102. During use of ultracapacitor pack 120 in the machine, e.g., during charging and discharging of ultracapacitor cells 122, ultracapacitor cells 122 may become unbalanced. That is, because of various factors such as manufacturing tolerances, leakage currents, etc., the output voltages of individual ultracapacitor cells 122 may vary over time with respect to one another. Further, the difference between the output voltages of the individual ultracapacitor cells 122 may increase over time and with continued use.

To combat the problem of unbalanced ultracapacitor cells 122, ultracapacitor pack 120 may include hardware or circuitry (not shown) to balance the cells using known techniques, such as via passive or active balancing techniques. These techniques may be used to regulate the output voltages of the ultracapacitor cells 122 to bring the output voltages of each ultracapacitor cell 122 closer to a common value. If an active cell balancing scheme is used, short circuit detection system 160 may be able to activate the cell balancing process by sending commands to the circuitry included in ultracapacitor pack 120 to selectively balance ultracapacitor cells 122, consistent with the embodiments discussed below.

Short circuit detection system 160 may also implement one or more short circuit detection algorithms and programs, which, as discussed below, may involve performing cell balancing, in order to detect a short-circuited ultracapacitor cell 122 within ultracapacitor pack 120. In exemplary disclosed embodiments, short circuit detection system 160 may be capable of detecting a short-circuited cell by measuring the output voltages of one or more ultracapacitor modules 121 without the need to measure the output voltages of individual ultracapacitor cells 122.

As shown in FIG. 2, short circuit detection system 160 may include a processor 161, a storage 162, a memory 163, and one or more input/output ports 164. Processor 161 may include one or more processing devices, such as one or more microprocessors and/or embedded controllers, such as those manufactured by Freescale™, Atmel®, Texas Instruments, etc., or any other type of processor. Storage 162 may include a volatile or non-volatile, magnetic, semiconductor, tape, optical, removable, nonremovable, or other type of computer-readable medium or computer-readable storage device. Storage 162 may store programs and/or other information, such as ultracapacitor cell short circuit detection programs and any other information used to detect short-circuited ultracapacitor cells 122 within ultracapacitor pack 120, as discussed in greater detail below. Memory 163 may include one or more storage devices configured to store information used by short circuit detection system 160 to perform certain functions related to disclosed embodiments.

In one embodiment, memory 163 may include one or more short circuit detection programs or subprograms loaded from storage 162 or elsewhere that, when executed by processor 161, perform various procedures, operations, or processes consistent with the disclosed embodiments. For example, memory 163 may include one or more programs that enable short circuit detection system 160 to, among other things, perform cell balancing among ultracapacitor cells 122, measure a module voltage generated by each of ultracapacitor modules 121 after performing the cell balancing but before applying a load of the machine to ultracapacitor pack 120, and determine whether an ultracapacitor cell among ultracapacitor cells 122 is short-circuited based on a comparison of the measured module voltages.

Input/output ports 164 may enable short circuit detection system 160 to send and receive data to and from other devices and/or parts of power system 100. For example, one or more I/O ports 164 may be connected to bus 105 to enable short circuit detection system 160 to initiate the cell balancing processes discussed above. One or more I/O ports 164 may also be connected to bus 105 to enable short circuit detection system 160 to measure module voltages of each of the ultracapacitor modules 121. For example, while FIG. 2 shows bus 105 connected to the terminal ends of one ultracapacitor module 121, bus 105 may have similar connections to each ultracapacitor module 121 to enable short circuit detection system 160 to measure the output voltage of each ultracapacitor module 121.

Additionally, input/output ports 164 may enable short circuit detection system 160 to send commands to switch 150, e.g., via bus 106. Alternatively or additionally, short circuit detection system 160 may receive data regarding the state of switch 150 (e.g., open or closed) via one or more input/output ports 164. This information may be provided, e.g., by another device that controls the state of switch 150.

Input/output ports 164 may also enable short circuit detection system 160 to send indications and/or notifications that a short-circuited ultracapacitor cell 122 has been detected. For example, short circuit detection system 160 may display a fault warning to a user of the machine, or to someone else associated with the machine, to inform them that a short-circuit has been detected. In certain embodiments, as discussed below, short circuit detection system 160 may also indicate which ultracapacitor module 121 includes the short-circuited ultracapacitor cell 122.

While bus 105 is shown in FIG. 2 as connecting short circuit detection system 160 and ultracapacitor pack 120, those skilled in the art will appreciate that any other type of architecture may be used. For example, one or more buses may be used to connect short circuit detection system 160 to the terminal ends of each ultracapacitor module 121 to measure the module voltages, and a separate network may be used to connect short circuit detection system 160 to the cell balancing circuitry in ultracapacitor pack 120. This network may include any one of or combination of wired or wireless networks such as twisted pair wire, coaxial cable, optical fiber, and/or a digital network. The network may further include any network configured to enable communication via a CAN bus protocol.

Figure 3:
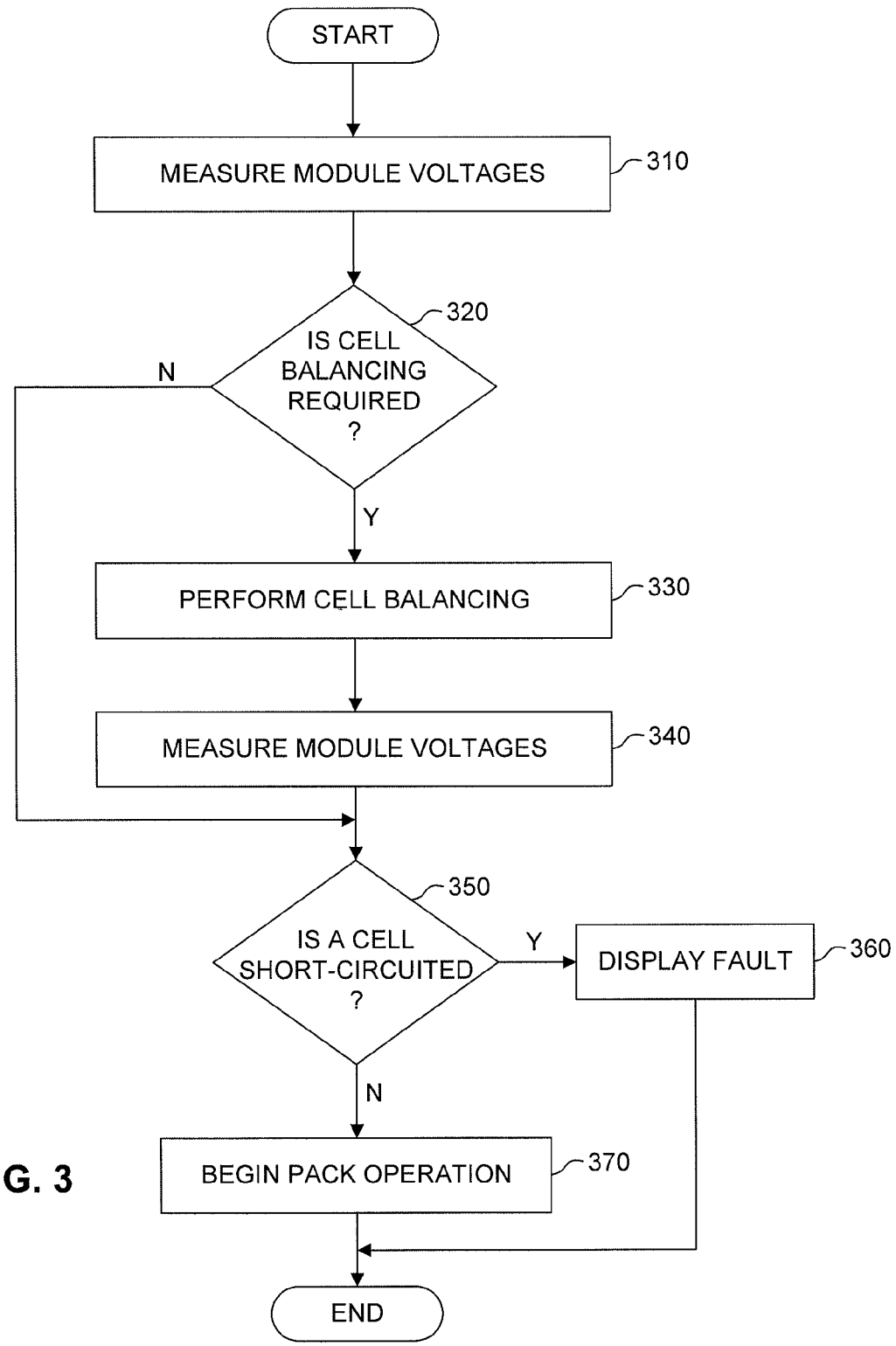
FIG. 3 is a flowchart depicting an exemplary disclosed method that may be performed by the detection system of FIG. 2.

As discussed above, short circuit detection system 160 may perform one or more short circuit detection processes, e.g., by executing one or more programs stored in memory or elsewhere. FIG. 3 illustrates a flowchart of an exemplary short circuit detection process that may be performed by short circuit detection system 160. For example, short circuit detection system 160 may measure the output voltages of one or more ultracapacitor modules 121 (i.e., the module voltages), e.g., via bus 105 (step 310). In certain embodiments, short circuit detection system 160 may perform step 310 when the machine is being turned on, but prior to a load of the machine being applied to ultracapacitor pack 120 (i.e., prior to closing switch 150).

Short circuit detection system 160 may then analyze the module voltages to determine whether cell balancing is required (step 320). Short circuit detection system 160 may determine whether cell balancing is required according to several different embodiments. According to one embodiment, short circuit detection system 160 may calculate a module unbalance voltage $\Delta V_m$ that is equal to the difference between the maximum module voltage and the minimum module voltage measured in step 310 (i.e., $\Delta V_M = V_{max} - V_{min}$). Short circuit detection system 160 may compare the module unbalance voltage $\Delta V_M$ to a threshold module unbalance voltage $V_T$, and if the threshold module unbalance voltage $\Delta V_M$ is greater than the threshold module unbalance voltage $V_T$ (i.e., $\Delta V_M > V_T$), then short circuit detection system 160 may determine that cell balancing is required (Step 320, Y). On the other hand, if $\Delta V_M \leq V_T$, short circuit detection system 160 may determine that cell balancing is not required (step 320, N).

The threshold module unbalance voltage $V_T$ may be determined based on the maximum output voltage of an individual ultracapacitor cell 122 and/or based on specifications obtained from the manufacturer. In one embodiment where the output voltage of an individual ultracapacitor cell 122 is between 0 and ~3 volts, the threshold module unbalance voltage $V_T$ may be 1.6 volts.

According to other embodiments, short circuit detection system 160 may determine whether cell balancing is required based on both the threshold module unbalance voltage, discussed above, and an output voltage of the entire ultracapacitor pack 120 (i.e., pack voltage $V_P$). For example, short circuit detection system 160 may determine whether the pack voltage $V_P$ is within a designated operating region. The designated operating region may be determined, e.g., based on manufacturer specifications and/or the application for which ultracapacitor pack 120 is being used. For example, in certain embodiments, the operating region may be between 300 and 345 volts, although other ranges may be used. If short circuit detection system 160 determines that the pack voltage $V_P$ is within the operating range, then short circuit detection system 160 may also determine whether the module unbalance voltage $\Delta V_M$ is greater than $V_T$. If $V_P$ is within the operating range and $\Delta V_M > V_T$, then short circuit detection system 160 may determine that cell balancing is required (step 320, Y). Otherwise, short circuit detection system 160 may determine that cell balancing is not required (step 320, N).

Figure 4:
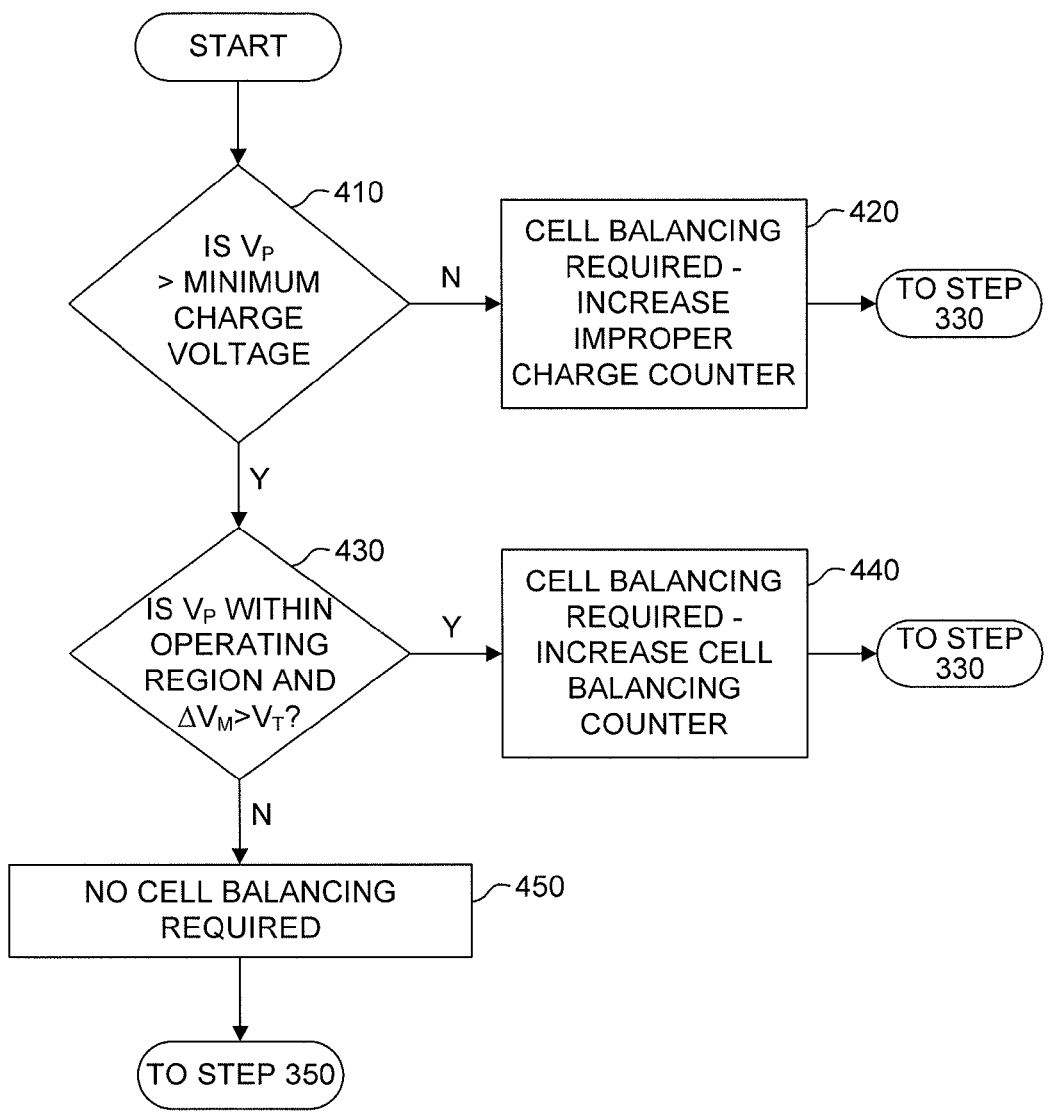
FIG. 4 is a flowchart depicting another exemplary disclosed method that may be performed by the detection system of FIG. 2.

Short circuit detection system 160 may determine whether cell balancing is required according to other embodiments, such as those described in greater detail below with respect to FIG. 4. Moreover, in yet other embodiments, short circuit detection system 160 may automatically perform cell balancing as part of the process shown in FIG. 3, without determining whether cell balancing is required (i.e., short circuit detection system 160 may begin execution of the process shown in FIG. 3 at step 330).

Continuing with the flowchart of FIG. 3, if short circuit detection system 160 determines that cell balancing is required (step 320, Y), short circuit detection system 160 performs cell balancing among ultracapacitor cells 122 included in ultracapacitor pack 120 (step 330). For example, short circuit detection system 160 may send one or more commands to initiate an active cell balancing scheme among ultracapacitor cells 122 to regulate the output voltages of the ultracapacitor cells 122 and bring the output voltages of each ultracapacitor cell 122 closer to a common value.

After performing cell balancing, short circuit detection system 160 may measure the module voltages of one or more of ultracapacitor modules 121, e.g., via bus 105 (step 340). As discussed above with regard to step 310, short circuit detection system 160 may perform step 340 prior to a load of the machine being applied to ultracapacitor pack 120 (i.e., prior to closing switch 150). Moreover, in certain embodiments, step 340 may be performed immediately after the cell balancing scheme in step 330 is complete. That is, step 340 may be performed automatically as a part of the same process of the cell balancing scheme in step 330, such that step 340 is performed within seconds of the completion of the cell balancing scheme in step 330.

Based on the module voltages measured in step 340 (or, if it was determined at step 320 that cell balancing was not required, based on the module voltages measured in step 310), short circuit detection system 160 may determine whether an ultracapacitor cell 122 has short circuited. Short circuit detection system 160 may determine whether an ultracapacitor cell 122 has short circuited according to several different embodiments.

In certain embodiments, short circuit detection system 160 may calculate a module unbalance voltage $\Delta V_M$ equal to a difference between the maximum module voltage $V_{max}$ and the minimum module voltage $V_{min}$ measured in step 340 and may compare the module unbalance voltage $\Delta V_M$ to a second threshold module unbalance voltage $V_{T2}$. If $\Delta V_M > V_{T2}$, then short circuit detection system 160 may determine that a short-circuited ultracapacitor cell 122 exists in ultracapacitor pack 120 (step 350, Y). Otherwise, short circuit detection system 160 may determine that there is no short-circuited ultracapacitor cell 122 in ultracapacitor pack 120 (step 350, N). Second threshold module unbalance voltage $V_{T2}$ may be determined based on the maximum output voltage of an individual ultracapacitor cell 122 and/or based on specifications obtained from the manufacturer. In one embodiment second threshold module unbalance voltage $V_{T2}$ may be equal to the threshold module unbalance voltage $V_T$.

In other embodiments, short circuit detection system 160 may determine whether ultracapacitor pack 120 includes a short-circuited ultracapacitor cell 122 by comparing the minimum module voltage $V_{min}$ measured in step 340 to a threshold module voltage $V_{TM}$. If $V_{min} < V_{TM}$, then short circuit detection system 160 may determine that a short-circuited ultracapacitor cell 122 exists in ultracapacitor pack 120 (step 350, Y). The threshold module voltage $V_{TM}$ likewise may be determined based on the maximum output voltage of an individual ultracapacitor cell 122, the number of ultracapacitor cells 122 included in an ultracapacitor module 121, and/or based on specifications obtained from the manufacturer. In one embodiment where eighteen ultracapacitor cells 122 are included in each ultracapacitor module 121, the threshold module voltage $V_{TM}$ may be ~43 volts.

In both embodiments discussed in the paragraphs above, short circuit detection system 160 may also determine whether the pack voltage of ultracapacitor pack 120 is within a second designated operating region. In certain embodiments, the second operating region used in step 350 may be different than the operating region used in step 320. For example, in embodiments where the operating region in step 320 is between 300 and 345 volts, the second operating region may be between 335 and 345 volts. If short circuit detection system 160 determines that the pack voltage of ultracapacitor pack 120 is within the second operating region and that $\Delta V_M > V_{T2}$ (in the first embodiment discussed above) or $V_{min} < V_{TM}$ (in the second embodiment discussed above), then short circuit detection system 160 may determine that a short-circuited ultracapacitor cell 122 exists in ultracapacitor pack 120 (step 350, Y).

In addition to determining whether a short-circuited ultracapacitor cell 122 exists at step 350, short circuit detection system 160 may also identify the ultracapacitor module 121 that includes the short-circuited ultracapacitor cell 122. In one embodiment, short circuit detection system 160 may identify the module corresponding to the minimum module voltage measured in step 340 as the module that includes the short-circuited ultracapacitor cell 122.

In other embodiments, short circuit detection system 160 may calculate a probability value for each module based on a difference between an average of two or more module voltages and the module voltage for that module. The probability value may represent a probability estimate that the short-circuited ultracapacitor cell 122 is included in that particular ultracapacitor module 121. For example, short circuit detection system 160 may calculate an average module voltage $V_{avg}$ that is an average value of two or more of the module voltages measured in step 340. In one embodiment, the average module voltage $V_{avg}$ may be the average of all of the module voltages measured in step 340. In another embodiment, the average module voltage $V_{avg}$ may be calculated as the average of the highest one-half of the module voltages measured in step 340. In yet another embodiment, the average module voltage $V_{avg}$ may be calculated as the average of all of the module voltages measured in step 340 except for $V_{max}$ and $V_{min}$. After calculating the average module voltage $V_{avg}$, short circuit detection system 160 may calculate a probability value for each module using the following equation:

$$P_j = \frac{[V_{avg} - V_{mj}]^2}{\sum_{i=1}^{n} [V_{avg} - V_{mi}]^2} \quad (1)$$

That is, short circuit detection system 160 may calculate a probability $P_j$ that the j-th ultracapacitor module 121 includes a short circuit by dividing the square of the difference between $V_{avg}$ and the module voltage $V_{mj}$ for the j-th ultracapacitor by the sum of the squares of the differences between $V_{avg}$ and the module voltage $V_{mi}$ for each ultracapacitor module 121 in the ultracapacitor pack 120 (where "n" equals the number of ultracapacitor modules 121 in the ultracapacitor pack 120). As discussed, short circuit detection system 160 may perform a similar calculation for each ultracapacitor module 121 to calculate the probability that the ultracapacitor module 121 includes a short-circuited ultracapacitor cell 122. In this embodiment, short circuit detection system 160 may determine that the ultracapacitor module 121 with the highest probability value $P_j$ includes the short-circuited ultracapacitor cell 122.

If, at step 350, short circuit detection system 160 determines that there is a short-circuited cell 122 in ultracapacitor pack 120 (step 350, Y), then short circuit detection system 160 may generate data to indicate that a short circuit exists (step 360). For example, short circuit detection system 160 may generate data to display a fault indication to an operator of the machine that includes ultracapacitor pack 120. The fault display may indicate that a short circuit exists. If, at step 350, short circuit detection system 160 identified an ultracapacitor module 121 that includes the short-circuited ultracapacitor cell 122 and/or determined a probability that one or more ultracapacitor modules 121 include a short-circuited ultracapacitor cell 122, then short circuit detection system 160 may also generate data to display this information along with the fault display. In other embodiments, the operator may simply see a generic fault display and the other information determined by short circuit detection system in step 350 may be displayed to a technician, e.g., during a diagnostic or repair process of the machine.

If short circuit detection system 160 determines that there is not a short-circuited cell in the ultracapacitor pack 120 (step 350, N), then short circuit detection system 160 may begin operation of ultracapacitor pack 120 (step 370). For example, short circuit detection system 160 may close switch 150 to apply a load of the machine (e.g., via bus 103) to ultracapacitor pack 120. Similarly, short circuit detection system 160 may send data to another control device of the machine to inform it that switch 150 may be closed.

In certain embodiments, step 370 may be performed even after a short-circuited ultracapacitor cell 122 is detected. For example, after a fault is displayed in step 360, short circuit detection system 160 may proceed to step 370 and allow operation of ultracapacitor pack 120 to begin, even if a short circuit was detected. Thus, a fault may be displayed to the operator of the machine, but the ultracapacitor pack 120 may still be able to provide power to power system 100. This way, an operator may continue to operate the machine with ultracapacitor pack 120, but will be aware of the short-circuited ultracapacitor cell 122 and thus have the option of bringing the machine in for maintenance.

As discussed above, short circuit detection system 160 may determine whether cell balancing is required according to several different embodiments. FIG. 4 illustrates an exemplary process that may be performed by short circuit detection system 160 according to yet other exemplary embodiments. According to the exemplary process in FIG. 4, short circuit detection system 160 may determine a reason why cell balancing is required and may also keep track of the number of times cell rebalancing is required for that particular reason. Short circuit detection system 160 may perform the process shown in FIG. 4 as a part of step 320 shown in FIG. 3.

For example, short circuit detection system 160 may determine whether the pack voltage $V_P$ of ultracapacitor pack 120 is greater than a minimum charge voltage (step 410). The minimum charge voltage may represent a minimum voltage above which ultracapacitor pack 120 should always be charged. The minimum charge voltage may be defined based on a voltage range of individual ultracapacitor cells 122, a number of ultracapacitor cells 122 included in ultracapacitor pack 120, and/or specifications from the manufacturer. In certain embodiments, the minimum charge voltage may be less than the lower limit of the operating region. For example, in the embodiment where the operating region is between 300 and 345 volts, the minimum charge voltage may be 200 volts.

If short circuit detection system 160 determines that the pack voltage $V_P$ is not greater than the minimum charge voltage (step 410, N), then short circuit detection system 160 may determine that cell balancing is required and may increase a counter used to count the number of times cell balancing is required due to an inadequate or improper charge voltage (step 420). Short circuit detection system 160 may then continue to step 330 of the flowchart shown in FIG. 3.

If short circuit detection system 160 determines that the pack voltage $V_P$ is greater than the minimum charge voltage (step 410, Y), then short circuit detection system 160 may determine whether the pack voltage $V_P$ is within the operating region and may determine whether the module unbalance voltage $\Delta V_M$ is greater than the threshold module unbalance voltage $V_T$ (step 430). If short circuit detection system 160 determines that the pack voltage $V_P$ is within the operating region and that the module unbalance voltage $\Delta V_M$ is greater than the threshold module unbalance voltage $V_T$ (step 430,Y), then short circuit detection system 160 may determine that cell balancing is required and may increase a counter used to count the number of times cell balancing is required due to cell balancing errors within the operating region (step 440). Short circuit detection system 160 may then continue to step 330 of the flowchart shown in FIG. 3.

If short circuit detection system 160 determines that the pack voltage $V_P$ is outside the operating region or that the module unbalance voltage $\Delta V_M$ is not greater than the threshold module unbalance voltage $V_T$ (step 430, N), then short circuit detection system 160 may determine that cell balancing is not required (step 450) and may continue to step 350 of the flowchart shown in FIG. 3.

INDUSTRIAL APPLICABILITY

The disclosed short circuit detection system 160 may be applicable to any type of power system that includes an ultracapacitor pack 120, such as a power system that may be included in a machine. The disclosed short circuit detection system 160 may be capable of detecting the presence of a short-circuited ultracapacitor cell 122 without having to measure the output voltage of each individual ultracapacitor cell 122. For example, short circuit detection system 160 may perform cell balancing of the ultracapacitor cells 122 within ultracapacitor pack 120 and, after balancing the ultracapacitor cells 122, may measure the module voltages of each ultracapacitor module 121 within ultracapacitor pack 120. Based on the measured module voltages, short circuit detection system 160 may then determine whether a short-circuited ultracapacitor cell 122 exists in ultracapacitor pack 120, e.g., according to one or more of the embodiments discussed above. Moreover, as discussed, short circuit detection system 160 may generate data indicating that a short-circuited ultracapacitor cell 122 exists, as well as data indicating which ultracapacitor module 121 contains or is likely to contain the short-circuited ultracapacitor cell 122.

By detecting the existence of a short-circuited ultracapacitor cell 122 and, in certain embodiments, identifying which ultracapacitor module 121 contains or is likely to contain the short-circuited ultracapacitor cell 122 without the need to measure the output voltage of individual ultracapacitor cells 122, the disclosed short circuit detection system 160 may reduce materials cost (less hardware is needed to measure module voltages than individual cell voltages), space requirements (less hardware allows for smaller configurations), and processing complexity (processing module voltages requires fewer calculations than processing each cell voltage) of short circuit detection systems. Thus, the disclosed short circuit detection system 160 may allow for safe operation of ultracapacitor pack 120 with a machine at a lower cost and with fewer constraints.

Moreover, by maintaining counters to keep track of the number of times cell balancing is required for different reasons, e.g., because ultracapacitor pack 120 is not charged to a sufficient voltage, because ultracapacitor cells 122 are out of balance even though ultracapacitor pack 120 is being used within the operating region, etc., parties associated with the machine that includes ultracapacitor pack 120 may be able to better understand and diagnose and potential causes for ultracapacitor cell unbalance and/or ultracapacitor cell short circuits. For example, if a machine is brought in to maintenance an ultracapacitor cell short circuit, and the improper charge counter is higher than the cell balancing error counter, then this may demonstrate that improper maintenance and charging of ultracapacitor pack 120 may have caused the problems with ultracapacitor pack 120. On the other hand, if the cell balancing error counter is higher than the improper charge counter, this may demonstrate that the ultracapacitor pack 120 itself may be faulty and that a product defect may have caused the problems. Determining the causes of these problems may help parties associated with the machine to allocate the costs of repairing ultracapacitor pack 120.

It will be apparent to those skilled in the art that various modifications and variations can be made to the disclosed short circuit detection system. Other embodiments will be apparent to those skilled in the art from consideration of the specification and practice of the disclosed short circuit detection system. It is intended that the specification and examples be considered as exemplary only, with a true scope being indicated by the following claims and their equivalents.

What is claimed is:

1. A computer-implemented method for detecting a short-circuited ultracapacitor cell on a machine, the method comprising:
    performing, by one or more processors, cell balancing among a plurality of ultracapacitor cells arranged within a plurality of ultracapacitor modules, each ultracapacitor module including at least two ultracapacitor cells connected in series;
    measuring, by the one or more processors, a module voltage generated by each of the plurality of ultracapacitor modules after performing the cell balancing and prior to applying a load of the machine to the ultracapacitor modules; and
    determining, by the one or more processors, that an ultracapacitor cell among the plurality of ultracapacitor cells is short-circuited when a module unbalanced voltage exceeds a threshold voltage, the module unbalanced voltage being equal to a difference between a maximum module voltage and a minimum module voltage determined from among the measured module voltages.

2. The computer-implemented method according to claim 1, further including:
    identifying the module corresponding to the minimum module voltage as the module that includes the ultracapacitor cell that is short-circuited; and
    generating data for indicating that the module corresponding to the minimum module voltage includes the ultracapacitor cell that is short-circuited.

3. A computer-implemented method for detecting a short-circuited ultracapacitor cell on a machine, the method comprising:
    performing, by one or more processors, cell balancing among a plurality of ultracapacitor cells arranged within a plurality of ultracapacitor modules, each ultracapacitor module including at least two ultracapacitor cells connected in series;
    measuring, by the one or more processors, a module voltage generated by each of the plurality of ultracapacitor modules after performing the cell balancing and prior to applying a load of the machine to the ultracapacitor modules;
    determining, by the one or more processors, whether an ultracapacitor cell among the plurality of ultracapacitor cells is short-circuited based on a comparison of the measured module voltages;
    calculating, by the one or more processors, an average module voltage that is an average of two or more of the measured module voltages; and
    calculating, by the one or more processors, a probability value for each module based on a difference between the average module voltage and the measured module voltage for that module, the probability value representing a probability that the ultracapacitor cell that is short-circuited is included in that module.

4. The computer-implemented method according to claim 3, further including:
    identifying the module with the highest probability value as the module that includes the ultracapacitor cell that is short-circuited.

5. The computer-implemented method according to claim 3, the probability value for each module being calculated according to:

$$P_j = \frac{[V_{avg} - V_{mj}]^2}{\sum_{i=1}^{n} [V_{avg} - V_{mi}]^2},$$

where $P_j$ is the probability value for a j-th ultracapacitor module, $V_{avg}$ is the average module voltage, $V_{mj}$ is the module voltage of the j-th ultracapacitor module, $V_{mi}$ is the module voltage of an i-th ultracapacitor module, and n is the number of ultracapacitor modules included in the plurality of ultracapacitor modules.

6. A computer-implemented method for detecting a short-circuited ultracapacitor cell on a machine, the method comprising:
    performing, by one or more processors, cell balancing among a plurality of ultracapacitor cells arranged within a plurality of ultracapacitor modules, each ultracapacitor module including at least two ultracapacitor cells connected in series;
    measuring, by the one or more processors, a module voltage generated by each of the plurality of ultracapacitor modules after performing the cell balancing and prior to applying a load of the machine to the ultracapacitor modules;
    determining, by the one or more processors, whether an ultracapacitor cell among the plurality of ultracapacitor cells is short-circuited based on a comparison of the measured module voltages;
    determining, by the one or more processors, a reason why the cell balancing is required; and
    counting, by the one or more processors, a number of times that the cell balancing is required because of the reason.

7. A system for detecting a short-circuited ultracapacitor cell on a machine, the system comprising:
    a non-transitory computer-readable memory storing instructions; and one or more processors capable of executing the instructions and configured to:
perform cell balancing among a plurality of ultracapacitor cells arranged within a plurality of ultracapacitor modules, each ultracapacitor module including at least two ultracapacitor cells connected in series;
measure a module voltage generated by each of the plurality of ultracapacitor modules after performing the cell balancing and before applying a load of the machine to the ultracapacitor modules; and
determine that an ultracapacitor cell among the plurality of ultracapacitor cells is short-circuited when a module unbalanced voltage exceeds a threshold voltage, the module unbalanced voltage being equal to a difference between a maximum module voltage and a minimum module voltage determined from among the measured module voltages.

8. The system according to claim 7, the one or more processors being further configured to:
identify the module corresponding to the minimum module voltage as the module that includes the ultracapacitor cell that is short-circuited; and
generate data for indicating that the module corresponding to the minimum module voltage includes the ultracapacitor cell that is short-circuited.

9. The system according to claim 7, further including the plurality of ultracapacitor modules.

10. A system for detecting a short-circuited ultracapacitor cell on a machine, the system comprising:
a non-transitory computer-readable memory storing instructions; and
one or more processors capable of executing the instructions and configured to:
perform cell balancing among a plurality of ultracapacitor cells arranged within a plurality of ultracapacitor modules, each ultracapacitor module including at least two ultracapacitor cells connected in series;
measure a module voltage generated by each of the plurality of ultracapacitor modules after performing the cell balancing and before applying a load of the machine to the ultracapacitor modules;
determine whether an ultracapacitor cell among the plurality of ultracapacitor cells is short-circuited based on a comparison of the measured module voltages;
calculate an average module voltage that is an average of two or more of the measured module voltages; and
calculate a probability value for each module based on a difference between the average module voltage and the measured module voltage for that module, the probability value representing a probability that the ultracapacitor cell that is short-circuited is included in that module.

11. The system according to claim 10, the one or more processors being further configured to:
identify the module with the highest probability value as the module that includes the ultracapacitor cell that is short-circuited.

12. The system according to claim 10, the probability value for each module being calculated according to:

$$P_j = \frac{[V_{avg} - V_{mj}]^2}{\sum_{i=1}^{n} [V_{avg} - V_{mi}]^2},$$

where $P_j$ is the probability value for a j-th ultracapacitor module, $V_{avg}$ is the average module voltage, $V_{mj}$ is the module voltage of the j-th ultracapacitor module, $V_{mi}$ is the module voltage of an i-th ultracapacitor module, and n is the number of ultracapacitor modules included in the plurality of ultracapacitor modules.

13. A system for detecting a short-circuited ultracapacitor cell on a machine, the system comprising:
a non-transitory computer-readable memory storing instructions; and
one or more processors capable of executing the instructions and configured to:
perform cell balancing among a plurality of ultracapacitor cells arranged within a plurality of ultracapacitor modules, each ultracapacitor module including at least two ultracapacitor cells connected in series;
measure a module voltage generated by each of the plurality of ultracapacitor modules after performing the cell balancing and before applying a load of the machine to the ultracapacitor modules;
determine whether an ultracapacitor cell among the plurality of ultracapacitor cells is short-circuited based on a comparison of the measured module voltages;
determine a reason why the cell balancing is required; and
maintain a counter that counts a number of times that the cell balancing is required because of the reason.

14. A non-transitory computer-readable storage device storing instructions that, when executed, enable one or more processors to:
perform cell balancing among a plurality of ultracapacitor cells arranged within a plurality of ultracapacitor modules, each ultracapacitor module including at least two ultracapacitor cells connected in series;
measure a module voltage generated by each of the plurality of ultracapacitor modules after performing the cell balancing and before applying a load of a machine to the ultracapacitor modules; and
determine that an ultracapacitor cell among the plurality of ultracapacitor cells is short-circuited when a module unbalanced voltage exceeds a threshold voltage, the module unbalanced voltage being equal to a difference between a maximum module voltage and a minimum module voltage determined from among the measured module voltages.

15. The non-transitory computer-readable storage device according to claim 14, the instructions further enabling the one or more processors to:
identify the module corresponding to the minimum module voltage as the module that includes the ultracapacitor cell that is short-circuited; and
generate data for indicating that the module corresponding to the minimum module voltage includes the ultracapacitor cell that is short-circuited.

16. A non-transitory computer-readable storage device storing instructions that, when executed, enable one or more processors to:
perform cell balancing among a plurality of ultracapacitor cells arranged within a plurality of ultracapacitor modules, each ultracapacitor module including at least two ultracapacitor cells connected in series;
measure a module voltage generated by each of the plurality of ultracapacitor modules after performing the cell balancing and before applying a load of a machine to the ultracapacitor modules;

determine whether an ultracapacitor cell among the plurality of ultracapacitor cells is short-circuited based on a comparison of the measured module voltages;

calculate an average module voltage that is an average of two or more of the measured module voltages; and calculate a probability value for each module based on a difference between the average module voltage and the measured module voltage for that module, the probability value representing a probability that the ultracapacitor cell that is short-circuited is included in that module.

17. The non-transitory computer-readable storage device according to claim 16, the instructions further enabling the one or more processors to:

identify the module with the highest probability value as the module that includes the ultracapacitor cell that is short-circuited.

* * * * *